U S 0 0 6 7 4 0 5 5 3 B 1

US006740553B1

(12) United States Patent
Lee et al.

(10) Patent No.: US 6,740,553 B1
(45) Date of Patent: *May 25, 2004

(54) CAPACITOR FOR SEMICONDUCTOR MEMORY DEVICE AND METHOD OF MANUFACTURING THE SAME

(75) Inventors: Kee Jeung Lee, Seoul (KR); Il Keoun Han, Ich'on Kyoungki-do (KR); Hong Seon Yan, Youngin Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/606,097

(22) Filed: Jun. 26, 2000

(30) Foreign Application Priority Data

| Jun. 25, 1999 | (KR) | 1999-24218 |
| Jun. 25, 1999 | (KR) | 1999-24219 |

(51) Int. Cl.$^7$ ........................................ H01L 21/8242
(52) U.S. Cl. .................. 438/240; 438/239; 438/253; 438/255; 438/386; 438/398; 438/785
(58) Field of Search ................. 438/296, 240, 438/253, 254, 255, 396, 397, 398, 785

(56) References Cited

U.S. PATENT DOCUMENTS

| 4,130,694 A | 12/1978 | Glass et al. | 429/193 |
| 5,248,629 A | * 9/1993 | Muroyama | 438/396 |
| 5,352,623 A | * 10/1994 | Kamiyama | 437/52 |
| 5,452,178 A | 9/1995 | Emesh et al. | 361/303 |
| 5,631,188 A | 5/1997 | Chang et al. | 438/253 |
| 5,741,721 A | 4/1998 | Stevens | 437/60 |
| 5,753,945 A | 5/1998 | Chivukula et al. | 257/295 |
| 5,763,300 A | 6/1998 | Park et al. | 438/240 |
| 5,776,660 A | 7/1998 | Hakey et al. | 430/296 |
| 5,837,576 A | 11/1998 | Chen et al. | 438/253 |
| 5,859,760 A | 1/1999 | Park et al. | 361/313 |
| 5,872,415 A | 2/1999 | Dreifus et al. | 310/311 |
| 5,936,831 A | 8/1999 | Kola et al. | 361/303 |
| 5,977,582 A | 11/1999 | Fleming et al. | 257/310 |
| 5,980,977 A | 11/1999 | Deng et al. | 427/79 |
| 5,994,757 A | * 11/1999 | Ichikawa et al. | 257/530 |
| 6,201,276 B1 | * 3/2001 | Agarwal et al. | 257/315 |
| 6,316,307 B1 | * 11/2001 | Lee et al. | 438/239 |
| 6,458,645 B2 | * 10/2002 | DeBoer et al. | 438/240 |

FOREIGN PATENT DOCUMENTS

| JP | 62136035 A | 6/1987 |
| JP | 63038248 A | 2/1988 |
| JP | 01173622 A | 7/1989 |
| JP | 02226754 A | 9/1990 |
| JP | 05167008 A | 7/1993 |
| JP | 05335483 A | 12/1993 |
| JP | 05-347187 | * 12/1993 |
| JP | 06163819 A | 6/1994 |
| JP | 07014993 A | 1/1995 |
| JP | 07045467 A | 2/1995 |
| JP | 11191612 A | 7/1999 |
| JP | 11233723 A | 8/1999 |
| JP | 11-233723 | * 8/1999 |

* cited by examiner

Primary Examiner—Amir Zarabian
Assistant Examiner—Khanh Duong
(74) Attorney, Agent, or Firm—Townsend and Townsend and Crew LLP

(57) ABSTRACT

Disclosed are a capacitor for a semiconductor device capable of increasing storage capacitance and preventing leakage current, and a method of manufacturing the same. According to the present invention, a lower electrode is formed on a semiconductor substrate. A surface of the lower electrode is surface-treated to prevent generation of a natural oxide layer. A TaON layer as a dielectric layer is deposited on the lower electrode. Impurities of the TaON layer are crystallized and out-diffused. And an upper electrode is deposited on the TaON layer. Herein, the TaON layer is formed by a chemical vapor reaction of Ta obtained from $O_2$ gas and $NH_3$ gas in an LPCVD chamber to which $O_2$ gas and $NH_3$ gas are supplied at a pressure of 0.1~10 Torr at a temperature of 300~600° C., respectively.

74 Claims, 12 Drawing Sheets

CAPACITOR FOR SEMICONDUCTOR MEMORY DEVICE AND METHOD OF MANUFACTURING THE SAME

This application claims priority from Korean Patent Application No. 99-24218, filed on Jun. 25, 1999, and Korean Patent Application No. 99-24219, filed on Jun. 25, 1999.

FIELD OF THE INVENTION

The present invention relates to a capacitor for a semiconductor memory device and a method of manufacturing the same.

BACKGROUND OF THE INVENTION

With recent progress in semiconductor manufacturing technology, the demand for memory devices has increased dramatically. Generally, a memory device having high capacitance is desirable. Capacitance of the capacitor can be increased by using a dielectric layer having a high dielectric constant or by enlarging the surface area of a lower electrode. Those conventional capacitors are made with a $Ta_2O_5$ layer having a dielectric constant higher than that of nitride-oxide(NO), thereby forming the lower electrode of a 3-dimensional structure.

FIG. 1 is a cross-sectional view of a capacitor in a conventional semiconductor memory device. Referring to FIG. 1, a field oxide layer 11 is formed at a predetermined portion of a substrate 10, a gate electrode 13 including a gate insulating layer 12 at a lower portion thereof is formed by a known technique at a predetermined portion of a semiconductor substrate 10. A junction region 14 is formed on semiconductor substrate 10 at each end of gate electrode 13, thereby forming a MOS transistor. A first interlevel insulating layer 16 and a second interlevel insulating layer 18 are formed on semiconductor substrate 10. A storage-node contact hole h is formed in the first and second interlevel insulating layers 16 and 18 so that the junction region 14 is exposed. A cylindrical type lower electrode 20 is formed by a known technology within the storage-node contact hole h to contact the exposed junction region 14. A hemispherical grain (HSG) layer 21 is formed on a surface of lower electrode 20 in order to increase the surface area of lower electrode 20. A $Ta_2O_5$ layer 23 is formed on the surface of HSG layer 21. At this time, $Ta_2O_5$ layer 23 is formed as follows. First, a surface of HSG layer 21 is cleaned before the $Ta_2O_5$ layer 23 is formed, and then the RTN (rapid thermal nitridation) process is performed externally thereby forming a silicon-nitride layer 22 on HSG layer 21. Next, a first $Ta_2O_5$ layer is formed at 30 temperature of approximately 400~450° C. with a thickness of 53~57 Å. Afterward, an annealing process is performed at low temperature, and then a second $Ta_2O_5$ layer is formed with the same thickness and by the same process as in the first $Ta_2O_5$ layer. Annealing processes at low and at high temperatures are continued in series thereby forming a single $Ta_2O_5$ layer 23. An upper electrode 24 is deposited on upper portions of the $Ta_2O_5$ layer and the second interlevel insulating layer 18, thereby completing the formation of a capacitor.

However, the conventional capacitor formed according to the above method using $Ta_2O_5$ as a dielectric layer has the following problems. First, a difference in the composition rate of Ta and 0 results since $Ta_2O_5$ generally has unstable stoichiometry. As a result, substitutional Ta atoms, i.e., vacancy atoms, are generated in the $Ta_2O_5$ layer. Since those vacancy atoms are oxygen deprived, leakage current results. The amount of vacancy atoms in the dielectric layer can be controlled depending on the contents and the bond strength of components in the $Ta_2O_5$ layer; however, it is difficult to eliminate them completely.

In order to stabilize the unstable stoichiometry of $Ta_2O_5$, the $Ta_2O_5$ layer is oxidized to remove the substitutional Ta atoms in the $Ta_2O_5$ layer. However, when the layer is oxidized, an oxide layer having a low dielectric constant is formed at an interface between the $Ta_2O_5$ layer and the lower electrode or between the $Ta_2O_5$ layer and the upper electrode since $Ta_2O_5$ easily oxidizes with the lower and upper electrodes made of polysilicon or TiN, thereby degrading the homogeneity of the interface.

Further, due to the reaction between an organic substance such as $Ta(OC_2H_5)_5$ used as a precursor and $O_2$(or $N_2O$) gas as a reaction gas, impurities result, such as carbon atoms C, carbon compounds($CH_4$, $C_2H_4$) and $H_2O$ in the $Ta_2O_5$ layer. These impurities increase leakage current in the capacitor and degrade the dielectric characteristics of the $Ta_2O_5$ layer. Accordingly, a capacitor having a large capacitance is difficult to obtain.

Moreover, the use of the $Ta_2O_5$ layer as a dielectric layer generates extra ex situ steps; one before formation of $Ta_2O_5$ layer and one after the cleaning step. Also, two thermal processes, at low and high temperatures, preferably are performed after the $Ta_2O_5$ layer has been formed. Therefore, forming a dielectric layer with $Ta_2O_5$ using a conventional method is cumbersome.

SUMMARY OF THE INVENTION

Accordingly, one object of the present invention is to provide a capacitor for a semiconductor device capable of obtaining a great capacitance by providing a dielectric layer having a high dielectric constant and which incurs little leakage current.

Furthermore, the other object of the present invention is to provide a method of manufacturing a capacitor for semiconductor device capable of simplifying its manufacturing process.

In order to accomplish the foregoing objects of the present invention, according to one embodiment, the present invention provides a capacitor for a semiconductor memory device having a lower electrode; a dielectric layer formed on the lower electrode; and an upper electrode formed on the dielectric layer, wherein the dielectric layer is a TaON layer.

According to another embodiment of the present invention, a method includes the steps of: forming a lower electrode on the semiconductor substrate; depositing a TaON layer as a dielectric layer on the lowerelectrode; and forming an upper electrode on the TaON layer.

Furthermore, according to the present invention, a method includes the steps of: forming a lower electrode on the semiconductor substrate; surface-treating to prevent generation of a natural oxide layer on a surface of the lower electrode; depositing a TaON layer as a dielectric layer on the lower electrode; out-diffusing impurities remaining in the TaON layer and crystallizing the TaON layer; and forming an upper electrode on the TaON layer.

Also, according to the present invention, a method includes the steps of: forming a lower electrode on the semiconductor substrate; surface-treating to prevent generation of a natural oxide layer on a surface of the lower electrode; depositing a TaON layer as a dielectric layer on the lower electrode; out-diffusing impurities remaining in the TaON layer and crystallizing the TaON layer; and forming an upper electrode on the TaON layer, wherein in the step of depositing the TaON layer, the TaON layer is formed by a surface chemical vapor reaction of Ta obtained from a precursor, $O_2$ gas and $NH_3$ gas in at a low pressure chemical vapor deposition (LPCVD) chamber to which $O_2$ gas and $NH_3$ gas are supplied a pressure of 0.1~10 Torr at a temperature of 300~600° C. respectively.

According to another embodiment of the present invention, a method includes the steps of: forming a lower electrode on the semiconductor substrate; surface-treating to prevent generation of a natural oxide layer on a surface of the lower electrode; depositing a TaON layer as a dielectric layer on the lower electrode; out-diffusing impurities remaining in the TaON layer and crystallizing the TaON layer; and forming an upper electrode on the TaON layer, wherein in the step of depositing the TaON layer, the TaON layer is formed by a surface chemical vapor reaction of Ta obtained from a precursor, $O_2$ gas and $NH_3$ gas in an LPCVD chamber to which $O_2$ gas and $NH_3$ gas are supplied at a pressure of 0.1~10 Torr at a temperature of 300~600° C. wherein the surface-treatment of the lower electrode is performed in the LPCVD chamber by using plasma in situ in an $NH_3$ gas or $N_2/H_2$ gas atmosphere at a temperature of 300~600° C. for 30 seconds~5 minutes, thereby nitrifying the surface of the lower electrode.

DETAILED DESCRIPTION OF THE INVENTION

Figure 1:
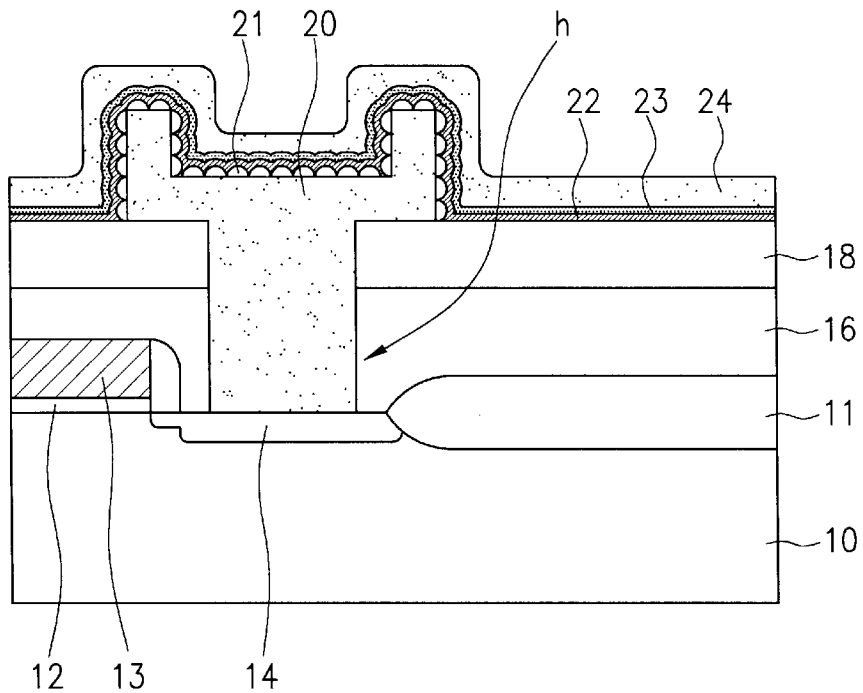
FIG. 1 is a simplified cross-sectional view of a conventional capacitor on a semiconductor device.
Figure 2A:
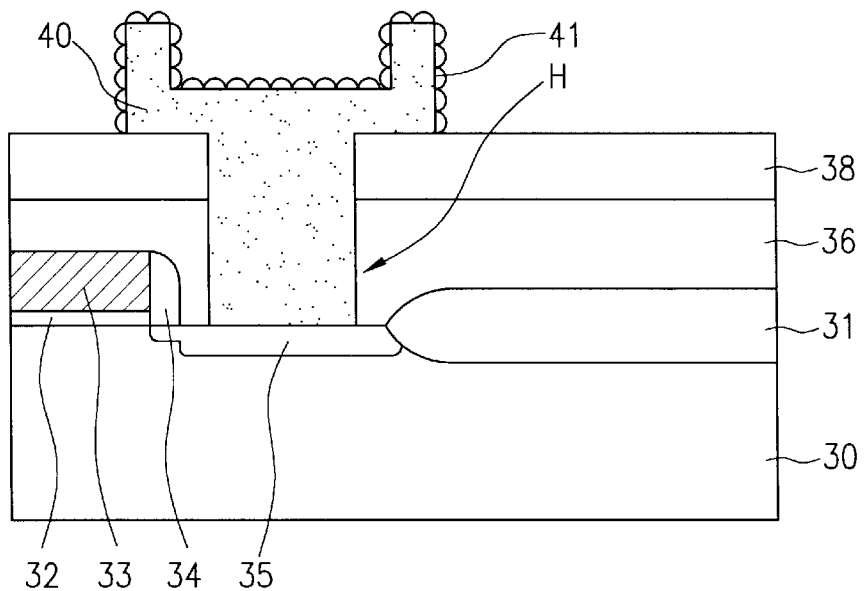
FIGS. 2A to 2C are simplified cross-sectional views of a capacitor for semiconductor devices according to one embodiment of the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed on a selected upper portion of substrate 30, and a spacer 34 is formed according to a known method at both sidewalls of gate electrode 33. A junction region 35 is formed on both sides of gate electrode 33 of substrate 30, thereby forming a metal oxide semiconductor (MOS) transistor. A first interlevel insulating layer 36 and a second interlevel insulating layer 38 are formed at the semiconductor substrate 30 in which the MOS transistor is formed. Afterward, interlevel insulating layers 38 and 36 are patterned so that a portion of junction region 35 is exposed, thereby forming a storage node contact hole H. A cylinder lower electrode 40 is formed to be in contact with the exposed junction region 35. An HSG layer 41 for enlarging the surface area of lower electrode 40 is formed according to a known method on the surface of the lower electrode.

Figure 2B:
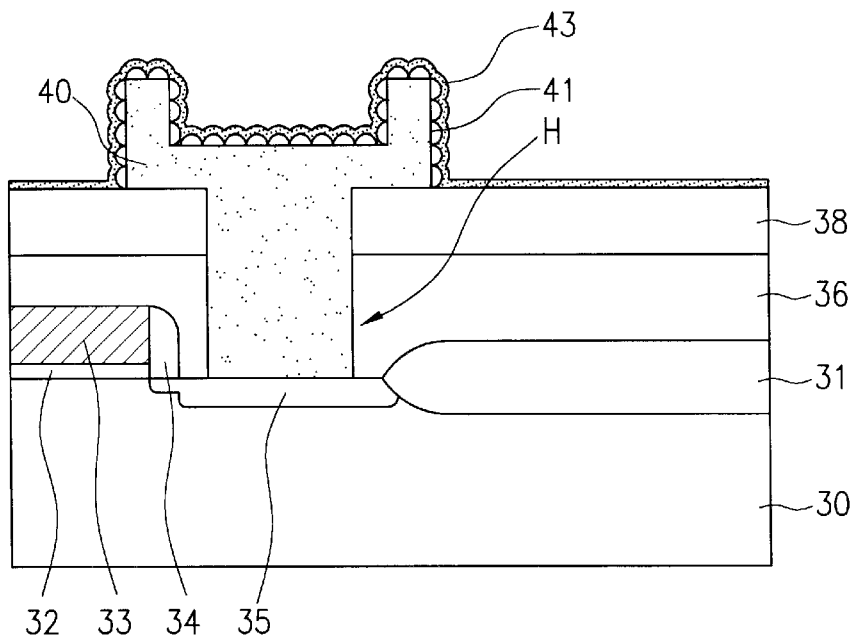

Referring to FIG. 2B, as a dielectric, a TaON layer 43 is, formed on lower electrode 40 and HSG layer 41. The TaON layer 43 is formed using a chemical vapor deposition method, for example LPCVD, where $Ta(OC_2H_5)_5$(tantalum ethylate) or $Ta(N(CH_3)_2)_5$(penta-dimetyl-amino-tantalum) material is used as a precursor. The $Ta(OC_2H_5)_5$ or $Ta(N(CH_3)_2)_5$ precursor is in liquid state as is known in the art, so the precursor is preferably supplied to the CVD chamber after conversion to a vapor state. That is, a selected amount of the precursor in liquid state is flowed using a flow controller such as an MFC (mass flow controller) and then is evaporated in an evaporizer or an evaporation tube including an orifice or a nozzle, thereby generating a Ta chemical vapor. The Ta chemical vapor is preferably supplied to the chamber at a rate of 80~100 mg/mm. The temperature of the evaporizer and a conduit coupled to the chamber is preferably maintained at 150~200° C. to prevent condensation of the Ta chemical vapor. The T a chemical vapor, the reaction gas, i.e., $O_2$ (excess gas), and $NH_3$ gas are reacted together in the LPCVD chamber, thereby forming an amorphous TaON layer 43 with a thickness of approximately 100~150 Å on HSG layer 41.

At this time, to minimize particle generation, Ta chemical vapor, $O_2$ gas and $NH_3$ gas are controlled to inhibit the gas phase reaction inside the chamber so that the gases react with each other only on the wafer surface. The gas phase reaction can be controlled by flow rates of the reaction gases, the pressure within the chamber, and other parameters. In one embodiment, each of the reaction gases $O_2$ and $NH_3$ are flowed into the chamber at 10~1000 sccm to inhibit the gas phase reaction, and the temperature in the LPCVD chamber is 300~600° C. with pressure of 0.1~10 Torr.

Figure 2C:
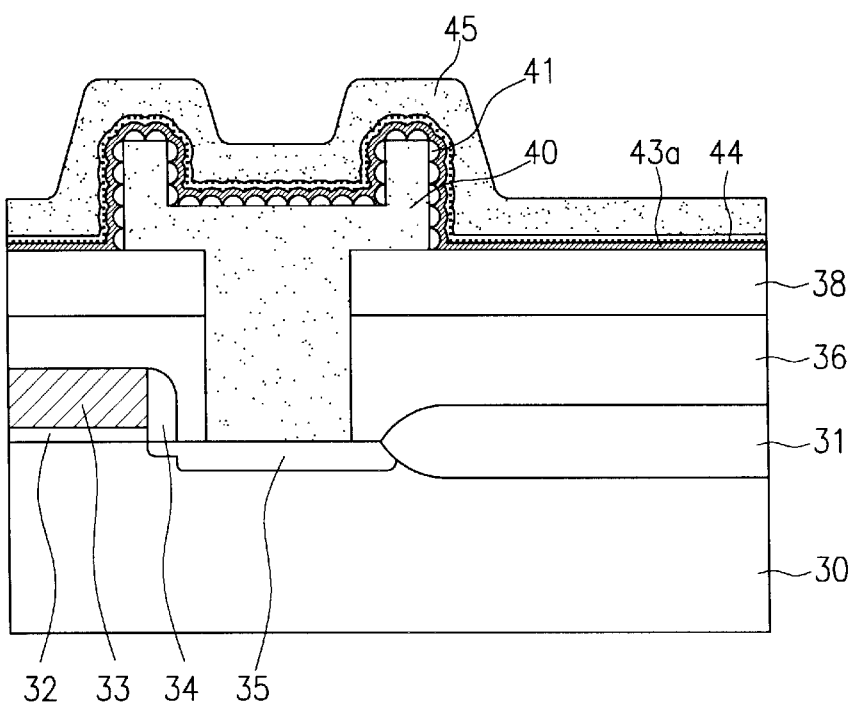

Afterward, as shown in FIG. 2C, the amorphous TaON layer 43 is crystallized by an annealing step. The crystallization step involves a rapid thermal process, in situ or ex situ in a chamber in an $N_2O$ or $O_2$ atmosphere with a temperature of 600~950° C. for 30 seconds ~10 minutes. The amorphous TaON layer 43 becomes a crystalline TaON 43a and then impurities such as C, $CH_4$, $C_2H_4$, $H_2O$ on the TaON 43a are removed. In another embodiment, the amorphous TaON layer 43 can be crystallized in a furnace of $N_2O$, $O_2$ or $N_2$ gas atmosphere at temperature of 600~950° C. Moreover, the crystallizing step can be performed in a furnace or RTP chamber of $NH_3$, $N_2$ or $N_2/H_2$ gas atmosphere at a temperature of 600~950° C. When an annealing step is performed in a nitrogen atmosphere, the amorphous TaON layer is crystallized, impurities in the layer are all diffused, and a surface of the TaON layer is nitrified, i.e., a thin layer of nitride is formed on the surface. As a result, a reaction between the TaON layer and an upper electrode is prevented.

After annealing TaON layer 43, a barrier metal layer 44, e.g., a TIN layer, is formed on the crystallized TaON layer 43a. An upper electrode 45, e.g., a doped polysilicon layer, is formed on barrier metal layer 44.

Figure 4:
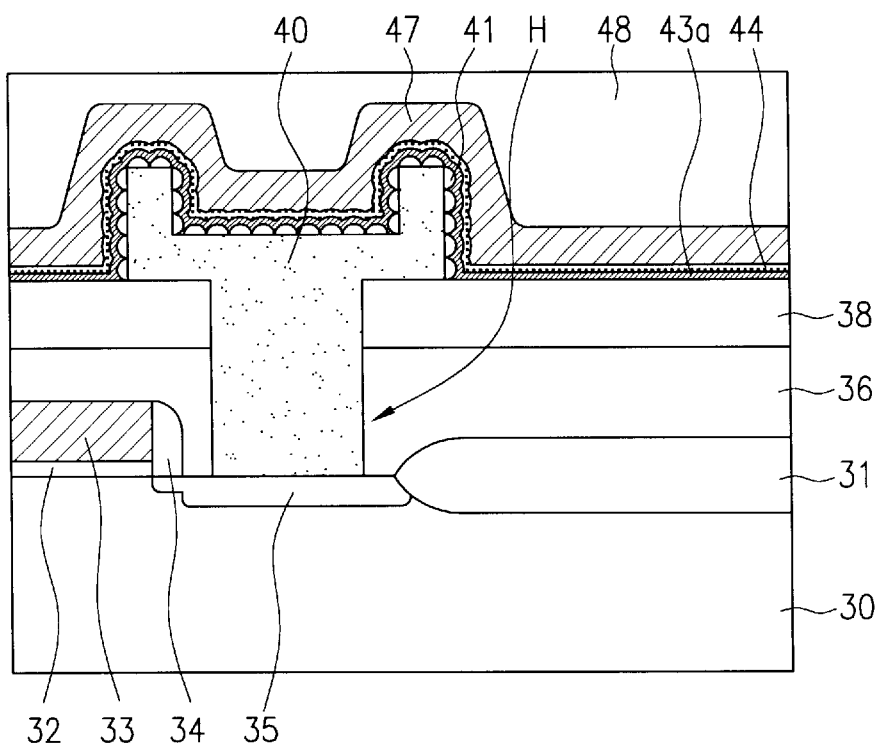

Instead of doped polysilicon, the upper electrode may be made from different materials, such as TiN, TaN, W, WN, WSi, Ru, $RuO_2$, Ir, $IrO_2$, Pt, and the like (see, metal layer 47 in FIG. 4). The upper electrode may be formed using LPCVD, plasma-enhanced chemical vapor deposition (PECVD), RF (radio-frequency) magnetic sputtering method, or the like. The upper electrode generally has a thickness of about 100~600 Å. A buffer layer 48 can be formed on the upper electrode made of metal layer 47 to prevent deterioration of electric characteristics of the capacitor (FIG. 4). A polysilicon layer can be used for the buffer layer 48. Similarly, the lower electrode may be formed from the material described above rather than polysilicon, as in the upper electrode.

As described above, the advantages of using TaON as a dielectric are as follows. The TaON layer 43a has a dielectric constant of 20~26, which is significantly higher than the NO layer. Moreover, TaON layer 43 has more stable stoichiometry than $Ta_2O_5$ since TaON layer 43 has a Ta—O—N structure. As a result, the TaON layer 43 has a superior tolerance for external electric impacts and high breakdown voltage and has very low leakage current. In addition, since TaON layer 43 does not oxidize easily, its interfaces with lower electrodes 40, 41 and upper electrode 44 are oxidized at a slower rate than the interfaces of the $Ta_2O_5$ layer. Therefore, the TaON layer deposited at the same thickness as the $Ta_2O_5$ layer remains thinner than the latter. As a result, capacitance of a capacitor having a TaON layer is higher than that of a capacitor having a $Ta_2O_5$ layer.

Figure 3:
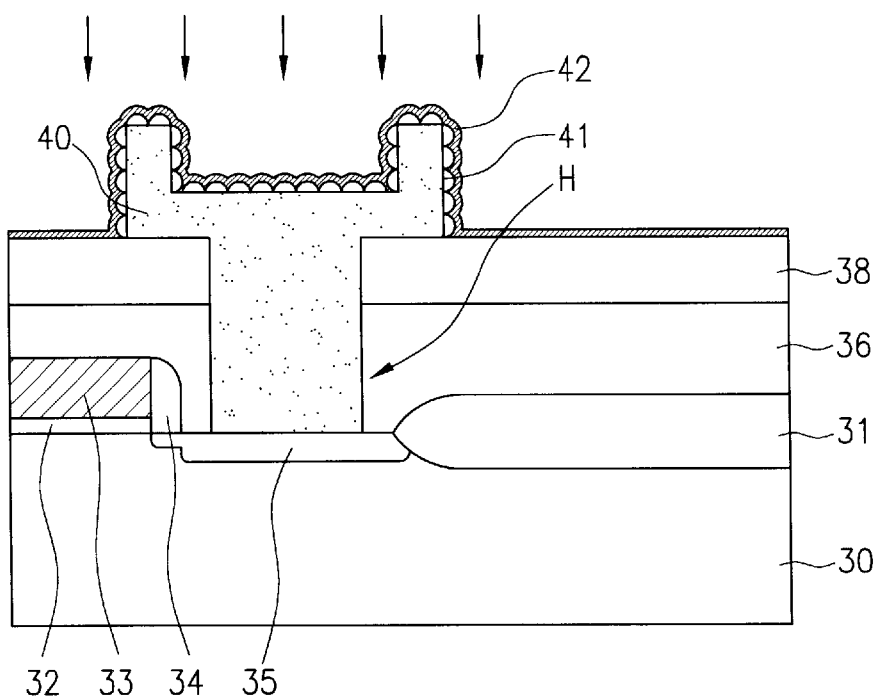
FIGS. 3–5 are simplified cross-sectional views of a capacitor for semiconductor devices according to one embodiment of the present invention.

Referring to FIG. 3, according to one embodiment, surfaces of a lower electrode 40 and a second interlevel insulating layer 38 are nitrified before a TaON layer 43 is formed to prevent formation of a natural oxide layer on a surface of the lower electrode. Nitrification is performed in situ within an LPCVD chamber using plasma discharged from a gas having nitrogen, such as an $NH_3$ gas or $N_2/H_2$ atmosphere, at a temperature of 300~600° C. for 30 seconds ~5 minutes. As a result, a nitride layer 42 of 5~30 Å is formed overlying the lower electrode 40 including a HSG layer 41 and the second interlevel insulating layer 38. The nitride layer prevents formation of an oxide layer on the surface of lower electrode 40 during a subsequent thermal process. In addition, since the in situ nitrification step is performed without interrupting the vacuum state, formation of a natural oxide layer is minimized, thereby preventing an increase in the thickness of the dielectric layer.

According to another embodiment, before depositing a TaON layer, the surfaces of a lower electrode 40 and a second interlevel insulating layer 38 are treated or anealed in a RTP chamber in an $NH_3$ gas atmosphere at a temperature of 650~950° C., in order to prevent formation of an oxide layer on a surface of lower electrode 40. The RTP treatment nitrifies surfaces of lower electrode 40 and second interlevel insulating layer 38, thereby forming a nitride layer 42 thereon. TaON layer 43 is deposited, in situ or ex situ, over nitride layer 42. Alternatively, nitride layer 42 may be formed by annealing the substrate in a furnace. The furnace-annealing is preferably performed in an $NH_3$ gas atmosphere at a temperature of 500~1000° C. According to this furnace-annealing, surfaces of lower electrode 40 including a HSG layer 41 and second interlevel insulating layer 38 are nitrified, thereby forming a nitride layer 42 on surfaces of lower electrode 40 and second interlevel insulating layer 38.

According to yet another embodiment, before depositing a TaON layer, surfaces of a lower electrode 40 and a second interlevel insulating layer 38 are cleaned using HF (hydrogen fluoride) vapor, HF solution or HF containing compound, in order to prevent formation of an oxide layer on lower electrode 40. In one implementation, before or after the cleaning step, surfaces of lower electrode 40 and the second interlevel insulating layer 38 are treated with an $NH_4OH$ solution or $H_2SO_4$ solution to improve the homogeneity of the interface.

According to one embodiment, a lower electrode 40 is treated thermally in an $N_2O$ or $O_2$ gas atmosphere before deposition of a TaON layer. The defects or non-uniformity due to dangling bonds of the polysilicon layer is improved, thereby improving oxidation resistivity of the oxide. A siliconnitride layer $Si_3N_4$ is subsequently deposited to a thickness of 5~30 Å on the thermally treated lower electrode, and then the TaON layer is deposited.

Figure 5:
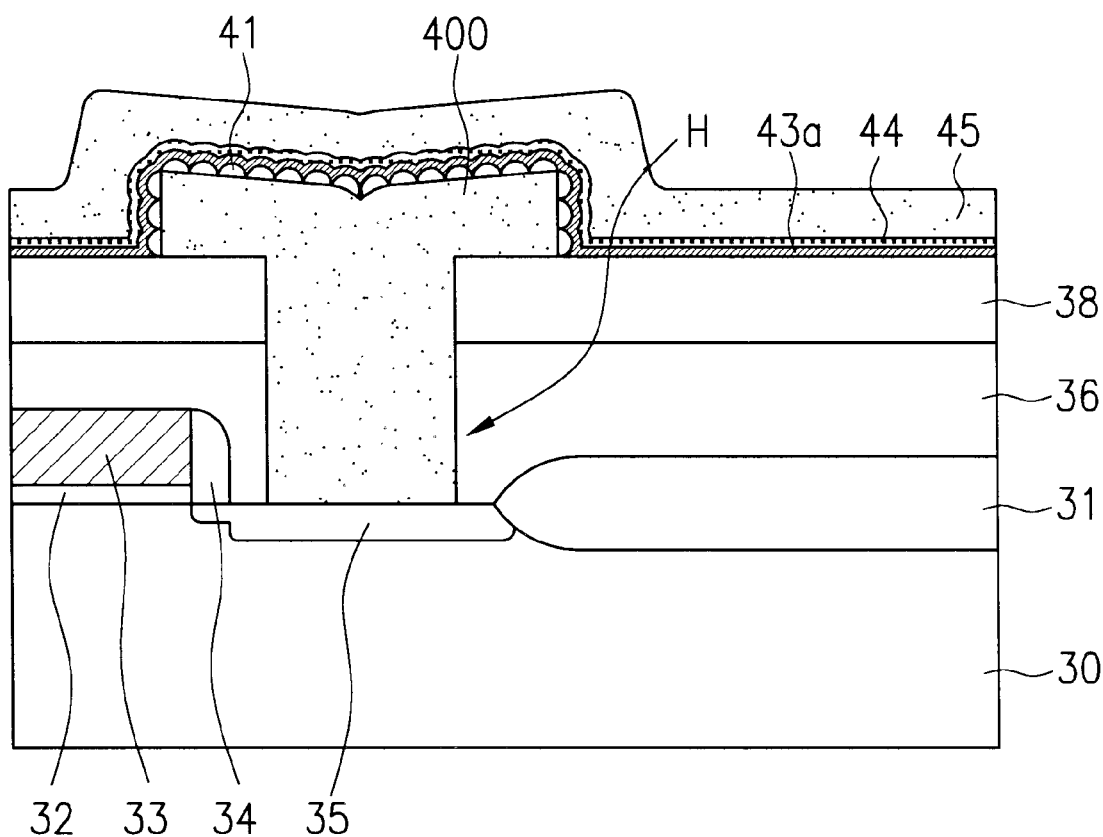

According to one embodiment, as shown in FIG. 5, a lower electrode 400 is formed as a stack structure. Although the surface area of the lower electrode 400 of the stack structure is smaller than that of the cylinder type described above, a DRAM device having a desirable capacitance can be obtained due to the excellent dielectric constant of a TaON layer 43a. A HSG layer 41 can be formed on a surface of lower electrode 400 of the stack structure.

First Experiment

Figure 6A:
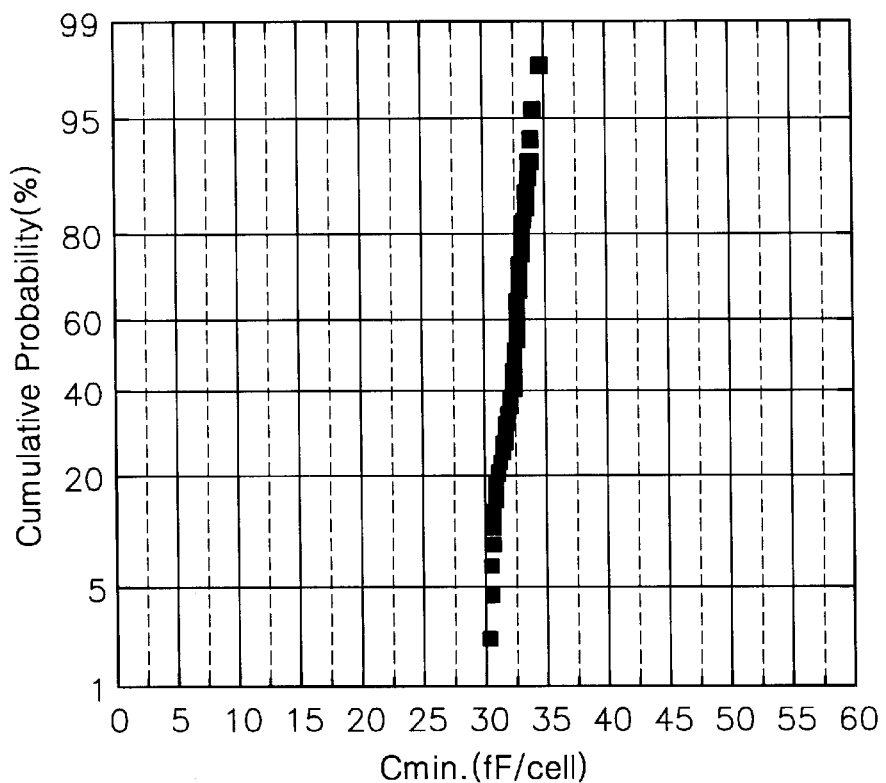
FIGS. 6A and 6B are graphs showing the minimum and maximum capacitance of a capacitor having a TaON layer, according to an experiment conducted by the inventors.
Figure 6B:
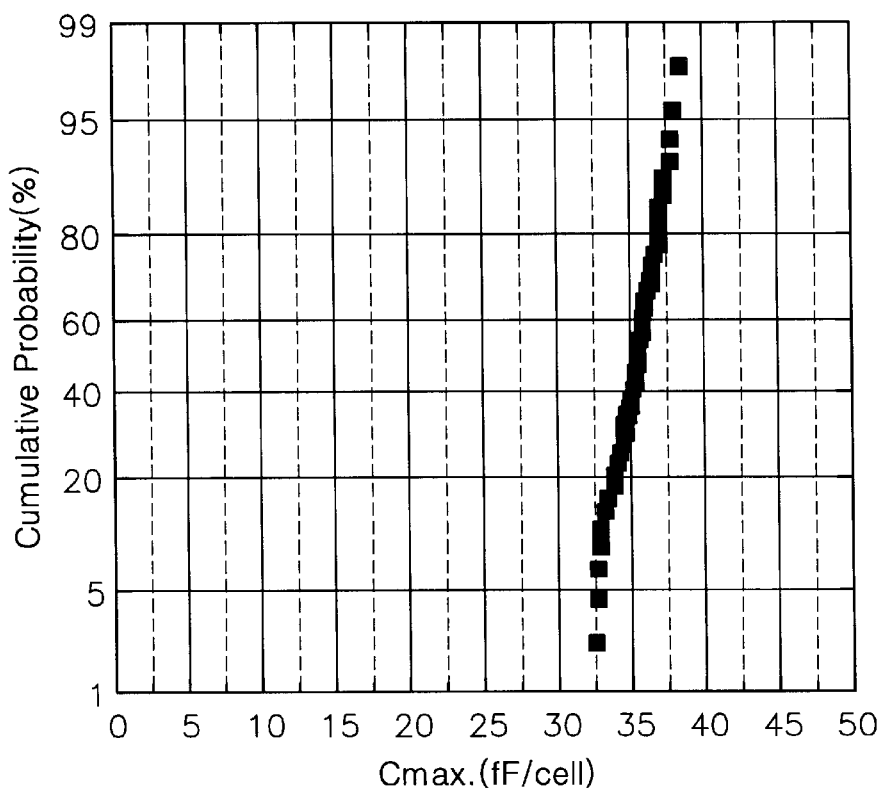
Figure 7A:
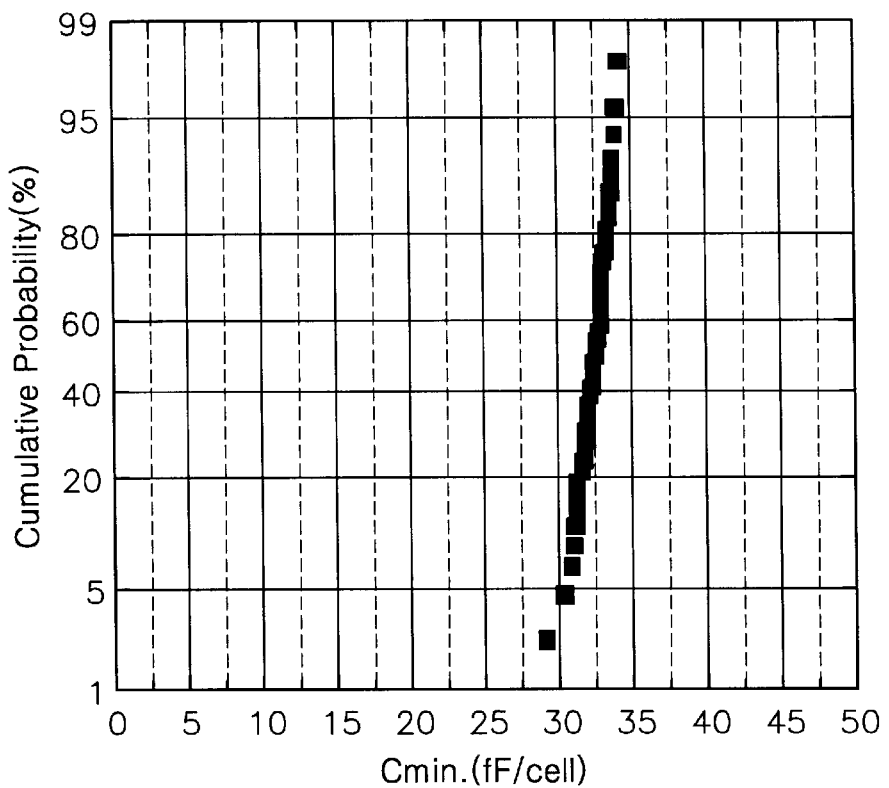
FIGS. 7A and 7B are graphs showing the minimum and maximum capacitance of a conventional capacitor having a $Ta_2O_5$ layer.
Figure 7B:
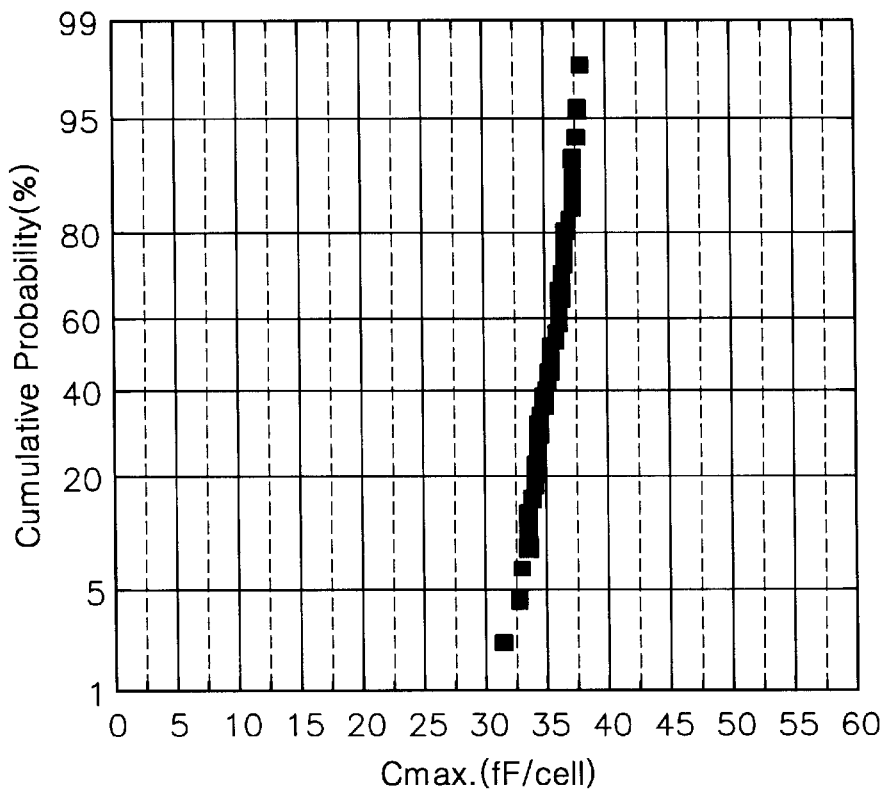

FIGS. 6A and 6B are graphs measuring the minimum and maximum capacitance of a capacitor having a TaON layer (hereinafter "TaON capacitor") according to one experiment conducted by the inventors. FIGS. 7A and 7B are graphs measuring the minimum and maximum capacitance of a conventional capacitor having a $Ta_2O_5$ layer (hereinafter "$Ta_2O_5$ capacitor")

The present experiment is provided to determine the variation in capacitance according to the thickness of a TaON layer; and a Ta2O5 layer. In the experiment, the TaON capacitor and the Ta2O5 capacitor were formed with dielectric layers, TaON and Ta2O5 layers, having a minimum thickness, i.e., the TaON layer having an equivalent thickness of 25A and the Ta2O5 layer having an equivalent thickness of 35 Å. Accordingly, the equivalent thickness can be formulated as follows.

$$T_{ox} = t_{Sio2} + (\epsilon_{Sio2}/\epsilon_{TaON} \text{ or } _{Ta2O5}) \times t_{TaON} \text{ or } _{Ta2O5} \quad \text{(equation 1)}$$

$T_{ox}$: equivalent thickness of dielectric layer
$t_{Sio2}$: thickness of natural oxide layer
$\epsilon_{Sio2}$: dielectric constant of natural oxide layer
$\epsilon_{TaON}$ or $_{Ta2O5}$: dielectric constant of TaON layer(or $Ta_2O_5$ layer)
$t_{TaON}$ or $_{Ta2O5}$: thickness of TaON layer(or $Ta_2O_5$ layer)

According to the above equation, the equivalent thickness of the dielectric layer varies according to the dielectric constant of the material used as a dielectric and the thickness of the natural oxide layer. Therefore, although the TaON layer and $Ta_2O_5$ layer are formed with an equal thickness, the TaON layer may have lower equivalent thickness due to its low natural oxidation ratio.

The minimum capacitance in FIGS. 6A and 7A is measured by applying −1.25V to the capacitors, and the maximum capacitance in FIG. 6B and 7B is measured by applying +1.25V to the capacitors. Referring to FIGS. 6A and 7A, when −1.25V is applied to the capacitor, the minimum capacitance Cmin of the TaON capacitor and $Ta_2O_5$ capacitor is measured on approximately the 30 and 35 fF/cells. Meanwhile, referring to FIGS. 6B and 7B, when +1.25V is applied to each capacitor, the maximum capacitance Cmax is measured on approximately the 30~40 fF/cells.

According to the results of the experiment, the TaON capacitor provides high capacitance like the $Ta_2O_5$ layer although the TaON layer has an equivalent thickness which is thinner than that of the $Ta_2O_5$ capacitor.

Second Experiment

Figure 8A:
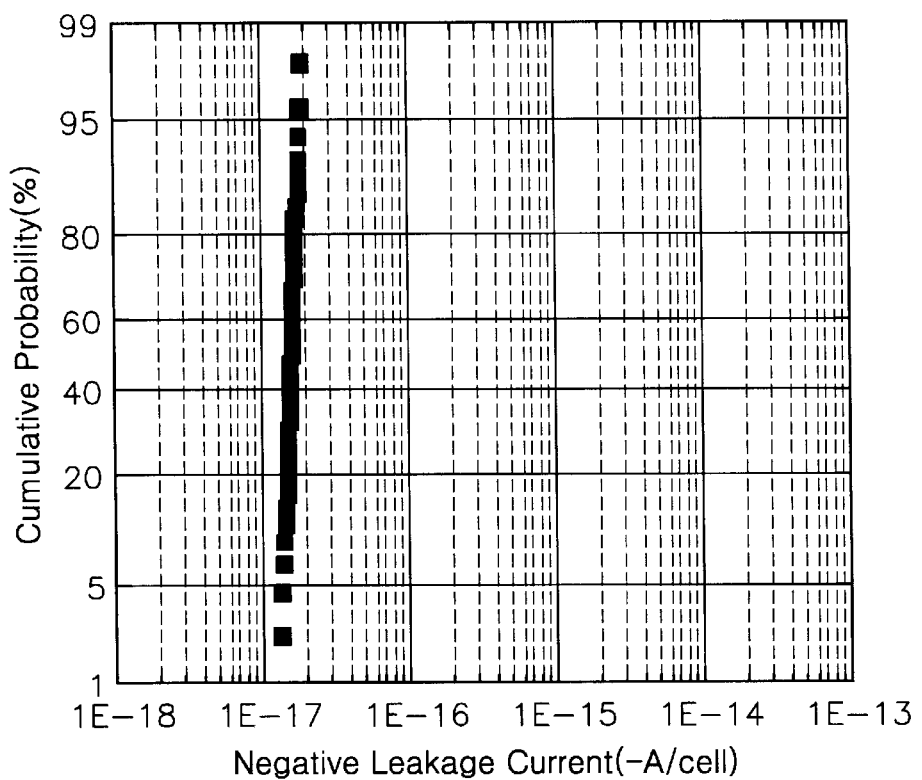
FIGS. 8A and 8B are graphs showing the negative and positive leakage currents of a capacitor having a TaON layer, according to another experiment conducted by inventors.
Figure 8B:
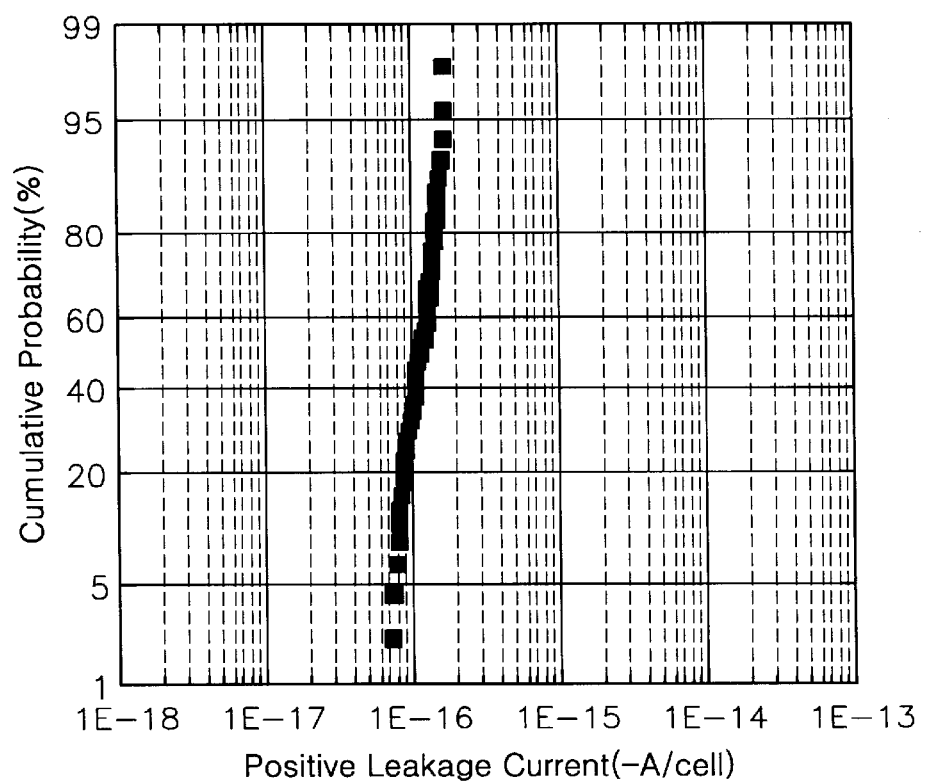
Figure 9A:
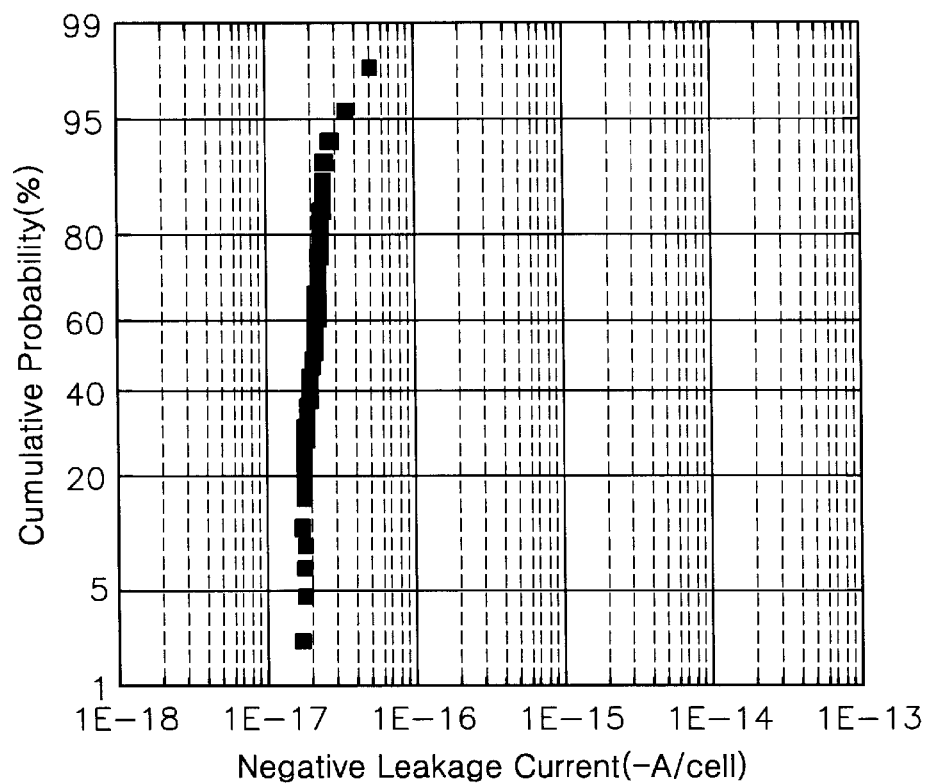
FIGS. 9A and 9B are graphs showing the negative and positive leakage currents of a conventional capacitor having a $Ta_2O_5$ layer.
Figure 9B:
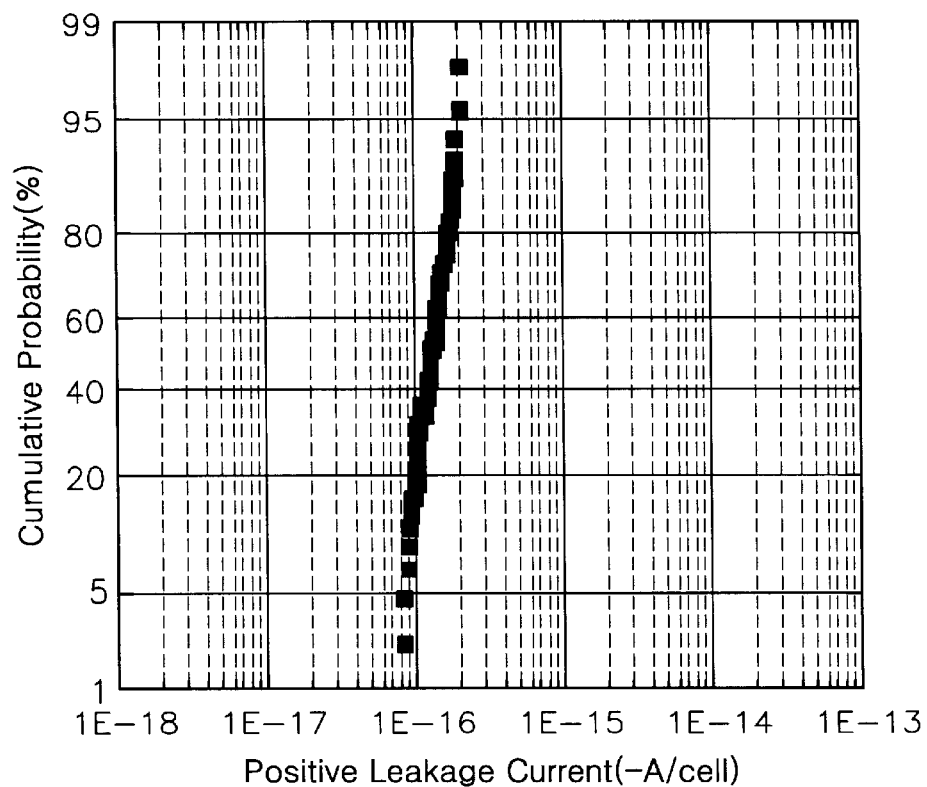

FIGS. 8A and 8B are graphs measuring the negative and positive leakage currents of a capacitor having a TaON layer. FIGS. 9A and 9B are graphs measuring the negative and positive leakage currents of a conventional capacitor having a $Ta_2O_5$ layer. The present experiment determines the degree of stability by measuring the leakage current of the TaON capacitor and the Ta2O5 capacitor when the same voltage is applied thereto. Negative leakage currents of the respective capacitors are measured by applying −1.25V thereto and positive leakage currents of the respective capacitors are measured by applying +1.25V thereto. The dielectric layers have the same thickness as in the first experiment.

Referring to FIGS. 8A and 9A, when −1.25V is applied to the capacitor, the minimum negative leakage current is measured as less than $10^{-16}$ A/cell. Furthermore, referring to FIGS. 8B and 9B, when +1.25V is applied to the capacitors, the positive leakage current of the TaON capacitor and the $Ta_2O_5$ capacitor is measured as less than $10^{-15}$ A/cell. As shown, both capacitors have low leakage current which is appropriate for high capacitance. However, the leakage current characteristic of the TaON layer is superior to that of the $Ta_2O_5$ layer when it is considered that the equivalent thickness of the TaON layer of the present invention is thinner than that of the $Ta_2O_5$ by 10 Å. Therefore, the TaON capacitor is more stable than the $Ta_2O_5$ layer.

Third Experiment

Figure 10A:
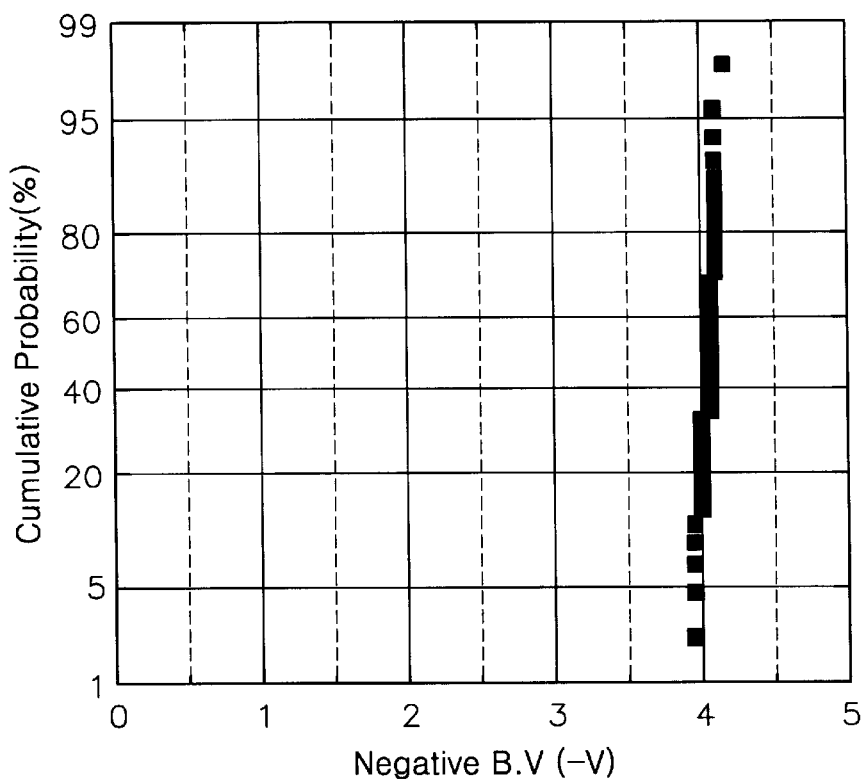
FIGS. 10A and 10B are graphs showing the negative and positive breakdown voltages of a capacitor having a TaON layer, according to yet another experiment conducted by the inventors.
Figure 10B:
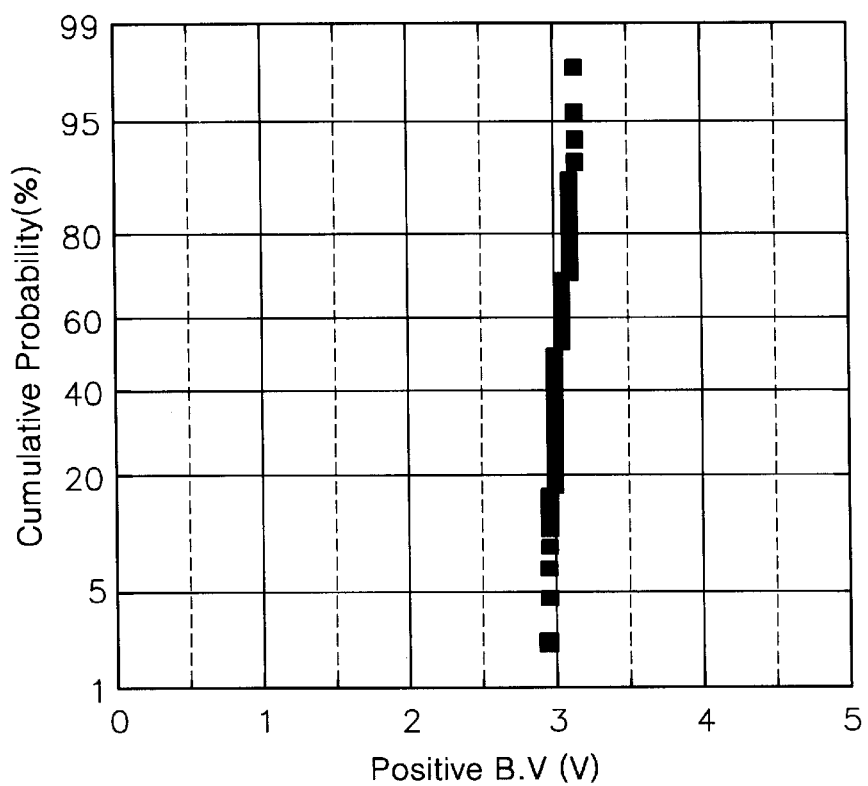
Figure 11A:
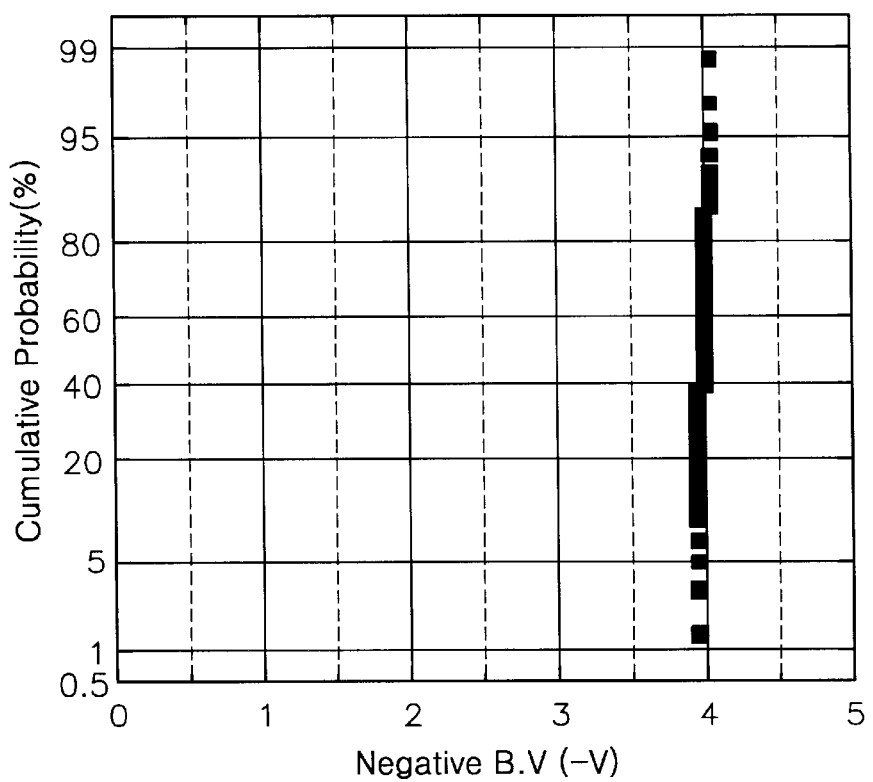
FIGS. 11A and 11B are graphs showing the negative and positive breakdown voltages of a conventional capacitor having a $Ta_2O_5$ layer.
Figure 11B:
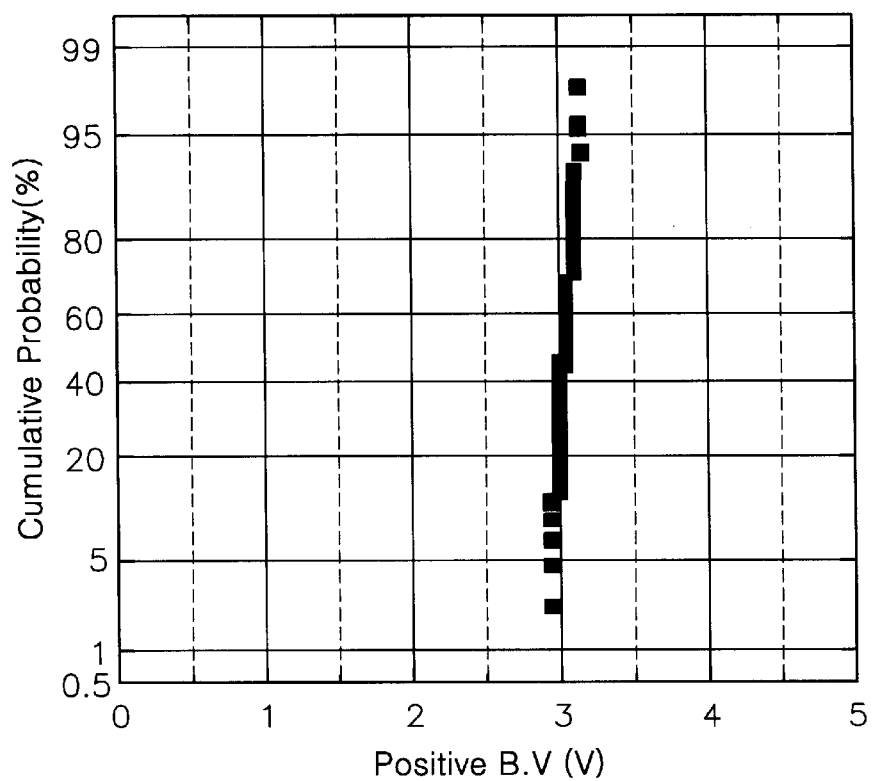

FIGS. 10A and 10B are graphs measuring the negative and positive breakdown voltage of a capacitor having a TaON layer. FIGS. 11A and 11B are graphs measuring the negative and positive breakdown voltage of a conventional $Ta_2O_5$ layer.

This experiment compares the breakdown voltages by applying a selected amount of current to the capacitors. As in the second experiment, this experiment also compares the stability of the respective capacitors. In this experiment, negative breakdown voltages of the respective capacitors are measured by applying −1 pA/cell, and positive breakdown voltages of the respective capacitors are measured by applying +1 pA/cell. The equivalent thickness of dielectric layers are the same as in the first and the second experiments, i.e., the TaON layer is 25 Å and the $Ta_2O_5$ is 35 Å.

Referring to FIGS. 10A and 11A, when a current of −1 pA/cell is applied, the negative breakdown voltages of the TaON and the $Ta_2O_5$ capacitors are measured as −3.8V and −4.2V respectively. Meanwhile, referring to FIGS. 10B and 11B, when a current of +1 pA/cell is applied, the positive breakdown voltages of the TaON and the $TaO_5$ capacitors are measured as 3.8V and 4.2V, respectively.

Herein, both of the capacitors have a high breakdown voltage appropriate for high capacitance. However, the breakdown voltage of the TaON layer is almost equal to that of the $Ta_2O_5$ layer although the equivalent thickness of the TaON layer of the present invention is less than that of the $Ta_2O_5$ layer. Therefore, the TaON capacitor is superior to the $Ta_2O_5$ layer in the aspect of breakdown voltage.

Fourth Experiment

Figure 12A:
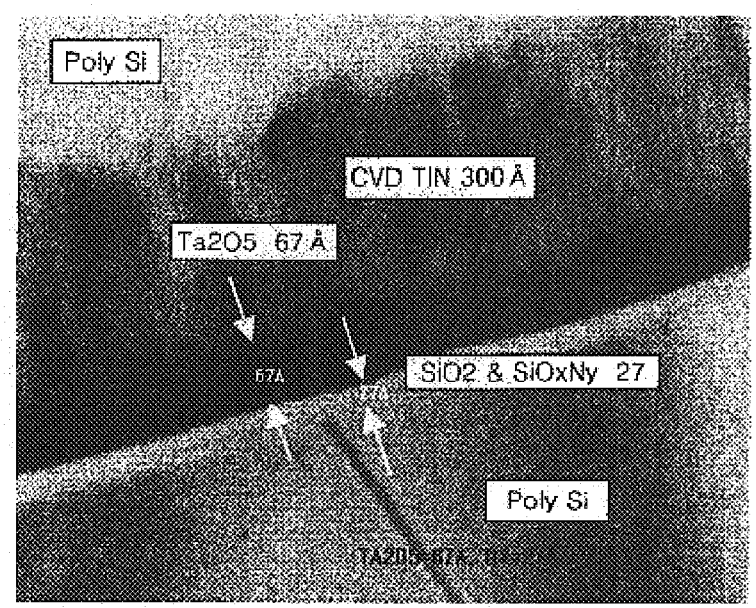
FIG. 12A is an SEM picture of a TaON layer annealed at a temperature of 700° C. under a $N_2O$ gas atmosphere for 60 minutes after its deposition.
Figure 12B:
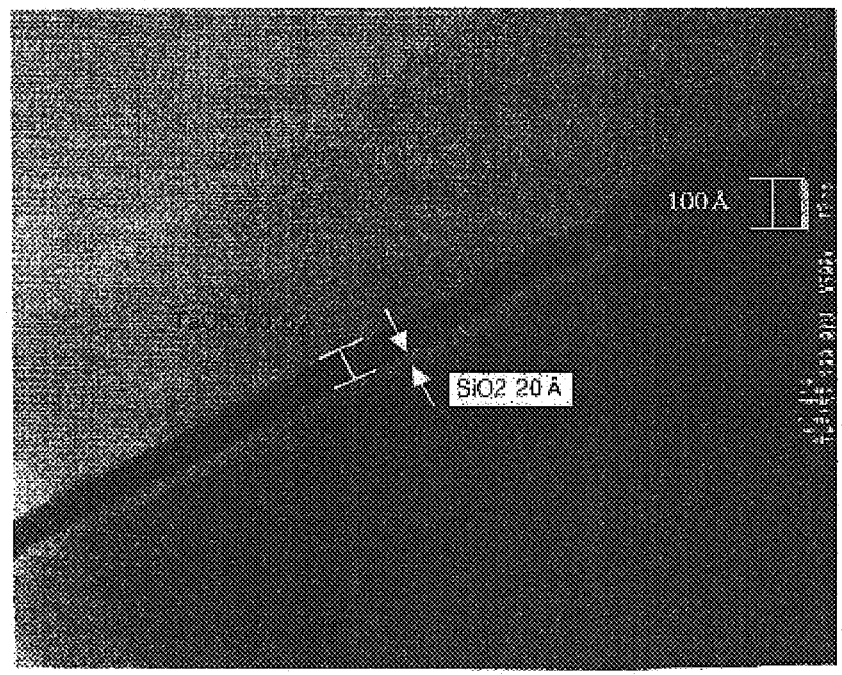
FIG. 12B is an SEM picture of a $Ta_2O_5$ layer annealed at a temperature of 700° C. under a $N_2O$ gas atmosphere for 60 minutes after its deposition.

FIG. 12A is an SEM (Scanning Electron Microscope) picture of a TaON layer annealed at a temperature of 700° C. in an $N_2O$ gas atmosphere for 60 minutes after its deposition. FIG. 12B is an SEM picture of a $Ta_2O_5$ layer Annealed at a temperature of 700° C. in an $N_2O$ gas atmosphere for 60 minutes after its deposition. Herein, the TaON layer and the $Ta_2O_5$ are deposited at 60A respectively.

Referring to FIG. 12A, when the TaON layer is annealed at 700° C. in an $N_2O$ gas atmosphere for 60 minutes after its deposition, the thickness of the TaON layer increases by about 0.5 Å and approximately 20 Å of a natural oxide layer is generated. Meanwhile, referring to FIG. 12B, when the $Ta_2O_5$ layer is annealed at 700° C. at an $N_2O$ gas atmosphere for 60 minutes after its deposition, the thickness of the $Ta_2O_5$ layer increases by about 7 Å and approximately 27 Å of a natural oxide layer is generated. As a result, it is obvious that the generation of natural oxide layer in the TaON layer is less, after the annealing step.

Fifth Experiment

Figure 13:
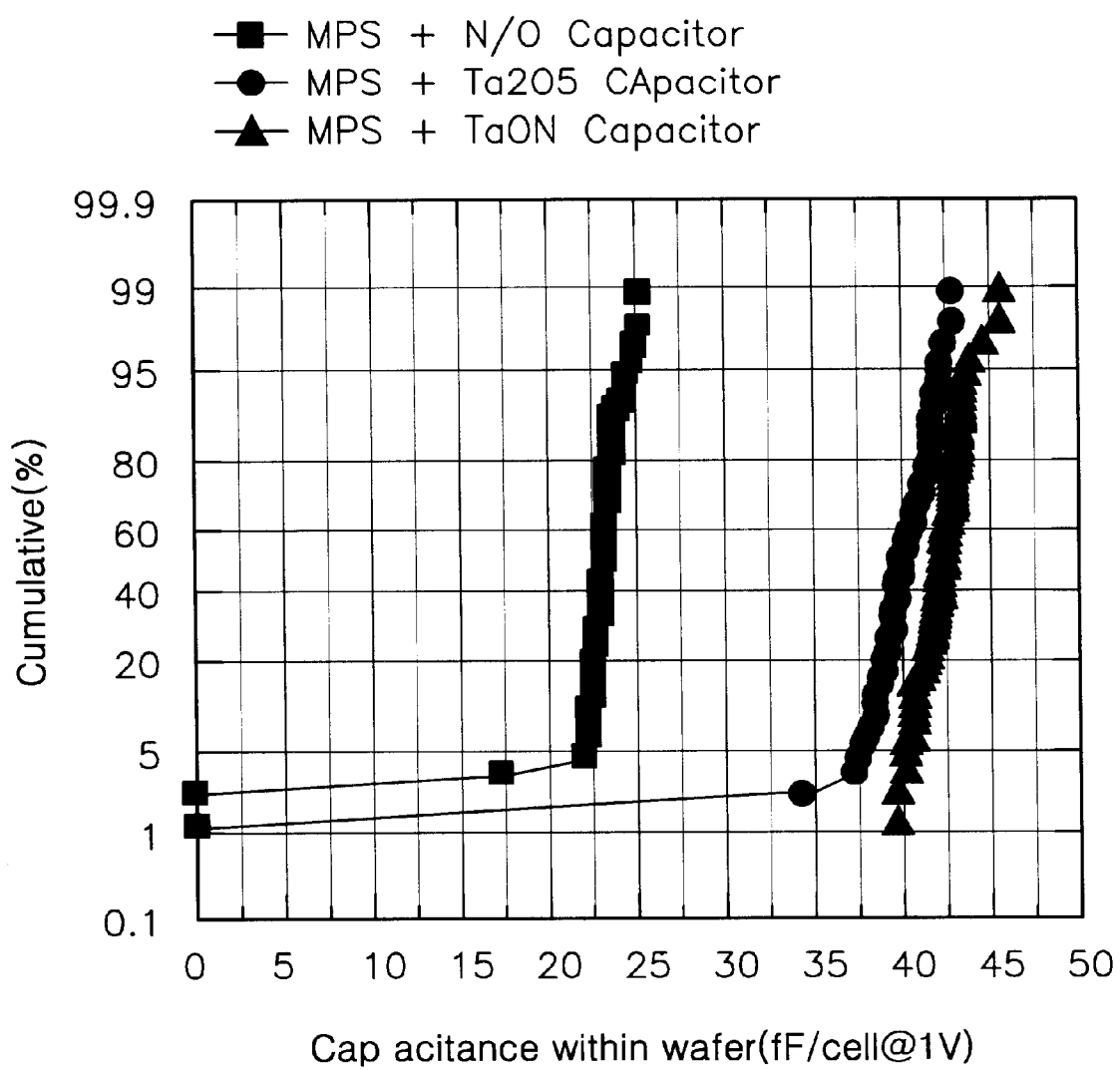
FIG. 13 is a graph showing the capacitance of a NO capacitor employing a NO layer as a dielectric, a $Ta_2O_5$ capacitor, and a TaON capacitor.

FIG. 13 is a graph showing the capacitance of the NO capacitor employing an NO layer as a dielectric, a $Ta_2O_5$ capacitor and a TaON capacitor. According to FIG. 13, under the same experimental conditions as above, the capacitance of the TaON capacitor is superior to that of the $Ta_2O_5$ capacitor.

As described above in detail, the following are the effects of using the TaON as a dielectric.

The TaON layer has high dielectric constant of 20~26 and also a stable combining structure of Ta—O—N. Accordingly, the dielectric characteristics of the TaON layer are superior to those of the NO layer, and have a more stable stoichiometry than those of $Ta_2O_5$. As a result, the TaON layer has an excellent tolerance for external electric impacts and high breakdown voltage and has very low leakage current.

Further, since the substitutional Ta atoms in the $Ta_2O_5$ layer do not exist in the TaON layer, an extra oxidation step may be omitted. Also, the TaON layer has very low oxidation reactivity so it does not easily oxidize with either the lower electrode or the upper electrode of the capacitor. Therefore, the thickness of the equivalent dielectric layer can be controlled to less than 35 Å.

Furthermore, after the TaON layer is formed, impurities of the TaON layer are removed and crystallized by a thermal processing treatment. As a result, the dielectric constant of the TaON layer is increased and leakage current of the capacitor is decreased.

According to one manufacturing method, the manufacturing process of the TaON layer in the present embodiment is characterized in that a nitrification is performed in situ before the deposition; a single layer of TaON is formed; and then an annealing step is performed for out-diffusing the impurities after the TaON layer is deposited. Consequently, the manufacturing process of this embodiment is simpler than that of the conventional $Ta_2O_5$.

When making a thin film, the TaON layer having a high dielectric constant is used as a dielectric layer for the capacitor. Consequently, the lower electrode can have a simple configuration thereby also simplifying the manufacturing step thereof.

Various other modifications will be apparent to and can be readily made by those skilled in the art without departing from the scope and spirit of the present invention which are defined by the claims.

What is claimed is:

1. A method of manufacturing a capacitor on a semiconductor substrate comprising:

forming a lower electrode over the semiconductor substrate;

nitrifying a surface of the lower electrode to prevent generation of a natural oxide layer on the surface of the lower electrodes;

depositing a TaON layer over the lower electrode, the TaON layer being an amorphous layer;

crystallizing the amorphous TaON layer; and forming an upper electrode over the TaON layer, wherein the TaON layer is formed by using an organic metal compound selected from the group consisting of $Ta(OC_2H_5)_5$ and $Ta(N(CH_3)_2)_5$ as a precursor, both containing Ta component.

2. The method of claim 1, wherein the TaON layer is formed by a surface chemical vapor reaction of the Ta chemical vapor obtained from the precursor, $O_2$ gas and $NH_3$ gas with pressure of 0.1–10 Torr at temperature of 300–600° C. in an LPCVD chamber.

3. The method of claim 2, wherein the $O_2$ gas and $NH_3$ gas are supplied by flux of 10–1000 sccm respectively.

4. The method of claim 2, wherein the Ta chemical vapor is obtained by fixing the dose of the precursor of 99.999% or above according to a flow controller and then evaporating in an evaporizer or an evaporation tube.

5. The method of claim 4, wherein the amount of Ta chemical vapor supplied in said chamber is 50–500 mg/mm.

6. The method of claim 4, wherein the evaporizer or the evaporation tube is maintained at temperature of 150–200° C., the method further comprising:

forming a nitride layer on the TaON layer.

7. A method of manufacturing a capacitor on a semiconductor substrate comprising:

forming a lower electrode over the semiconductor substrate;

depositing a TaON layer over the lower electrode, the deposited TaON layer being an amorphous layer;

annealing the TaON layer to crystallize the TaON layer; and forming an upper electrode over the TaON layer, wherein the TaON layer is deposited to a thickness of 50–150 Å, wherein TaON layer includes tantalum oxynitride.

8. A method of manufacturing a capacitor on a semiconductor substrate comprising:

forming a lower electrode over the semiconductor substrate;

depositing a TaON layer over the lower electrode;

forming a nitride layer over the TaON layer;

surface-treating to prevent generating of a natural oxide layer at a surface of the lower electrode, the surface of the lower electrode being nitrified as a result of the surface treatment; and forming an upper electrode over the TaON layer.

9. The method of claim 8, wherein the surface-treatment of the lower electrode is performed in the LPCVD chamber by using plasma in situ, and under $NH_3$ gas or $N_2/H_2$ gas atmosphere at temperature of 300–600° C. for 30 seconds-5 minutes, thereby nitrifying the surface of the lower electrode.

10. The method of claim 8, wherein the surface-treatment of the lower electrode is performed in the manner of RTP at temperature of 650–950° C. under $NH_3$ gas atmosphere, thereby nitrifying the surface of the lower electrode.

11. The method of claim 8, wherein the surface-treatment of the lower electrode is performed in a furnace of $NH_3$ gas atmosphere in situ or ex situ at temperature of 500–1000° C., thereby nitrifying the surface of the lower electrode.

12. The method of claim 8, wherein the surface-treatment of the lower electrode is performed by cleaning with HF vapor, HF solution or HF containing compound.

13. The method of claim 12, further comprising before or after the cleaning step, a step of interface-treating by using $NH_4OH$ solution or $H_2SO_4$ solution.

14. The method of claim 8, wherein the step of surface-treating of the lower electrode further comprises a step of thermal-treating a resultant under $N_2O$ or $O_2$ gas atmosphere, and a step of depositing a nitride layer on the thermal-treated surface by thickness of 5–30 Å.

15. A method of manufacturing a capacitor on a semiconductor substrate comprising:

forming a lower electrode over the semiconductor substrate;

depositing a TaON layer on the lower electrode, the TaON layer being amorphous;

annealing the TaON layer to out-diffuse impurities in the TaON layer and crystallize the amorphous TaON layer; and forming an upper electrode over the TaON layer, wherein the annealing step is performed in a nitrogen-containing environment to form a nitride layer on the TaON layer.

16. The method of claim 15, wherein the annealing step is performed using a RTP chamber or a furnace at temperature of 600–950° C.

17. A method of manufacturing a capacitor on a semiconductor substrate comprising:

forming a lower electrode over the semiconductor substrate;

depositing a TaON layer over the lower electrode, the TaON layer being amorphous;

annealing the TaON layer to out-diffuse impurities in the TaON layer and crystallize the amorphous TaON layer; and forming an upper electrode over the TaON layer, wherein the annealing step is performed in a RTP chamber or in a furnace at temperature of 600–950° C. under oxygen gas atmosphere.

18. A method of manufacturing a capacitor on a semiconductor substrates, comprising:

forming a lower electrode over the semiconductor substrate;

surface-treating to prevent generation of natural oxide layer on a surface of the lower electrode;

depositing a TaON layer as a dielectric layer over the lower electrode, the TaON layer being amorphous;

out-diffusing impurities in the TaON layer and crystallizing the TaON layer;

forming a barrier layer on the TaON layer; and forming an upper electrode on the barrier layer.

19. The method of claim 18, wherein the TaON layer is formed by using an organic metal compound selected from the group consisting of $Ta(OC_2H5)_5$ and $Ta(N(CH3)_2)_5$ as a precursor, both containing Ta components.

20. The method of claim 19, wherein the TaON layer is formed by a surface chemical vapor reaction of the Ta chemical vapor obtained from the precursor, $O_2$ gas and $NH_3$ gas with pressure of 0.1–10 Torr at temperature of 300–600° C. in an LPCVD chamber.

21. The method of claim 20, wherein the $O_2$ gas and $NH_3$ gas are supplied by flux of 10–1000 sccm respectively.

22. The method of claim 20, wherein the Ta chemical vapor is obtained by fixing the dose of the precursor of 99.999% or above according to a flow controller and then evaporating in an evaporizer or an evaporation tube.

23. The method of claim 22, wherein the amount of Ta chemical vapor supplied in said chamber is 50–500 mg/mm.

24. The method of claim 23, wherein the evaporizer or the evaporation tube is maintained at temperature of 150~200° C.

25. The method of claim 18, wherein the TaON layer is deposited by thickness of 50~150 Å.

26. The method of claim 18, wherein the surface-treatment of the lower electrode is performed in the LPCVD chamber by using plasma in situ, and under $NH_3$ gas or $N_2/H_2$ gas atmosphere at temperature of 300–600° C. for 30 seconds ~5 minutes, thereby nitrifying the surface of the lower electrode.

27. The method of claim 18, wherein the surface-treatment of the lower electrode is performed in the manner of RTP at temperature of 650~950° C. under $NH_3$ gas atmosphere, thereby nitrifying the surface of the lower electrode.

28. The method of claim 18, wherein the surface-treatment of the lower electrode is performed in a furnace of $NH_3$ gas atmosphere in situ or ex situ at temperature of 500~1000° C., thereby nitrifying the surface of the lower electrode.

29. The method of claim 18, wherein the surface-treatment of the lower electrode is performed by cleaning with HF vapor, HF solution or HF containing compound.

30. The method of claim 29, further comprising before or after the cleaning step, a step of interface-treating is performed by using $NH_4OH$ solution or $H_2SO_4$ solution.

31. The method of claim 18, wherein the step of surface-treating of the lower electrode further comprises a step of thermal-treating a resultant under $N_2O$ or $O_2$ gas atmosphere, and a step of depositing a nitride layer on the thermal-treated surface by thickness of 5~30 Å.

32. The method of claim 18, wherein the step of outdiffusing the impurities remained in the TaON layer and crystallizing the TaON layer is performed by annealing the TaON layer in a RTP chamber or in a furnace at temperature of 600~950° C. under nitrogenous gas atmosphere.

33. The method of claim 18, wherein the step of out-diffusing the impurities remained in the TaON layer and crystallizing the TaON layer is performed by annealing the TaON layer in a RTP chamber or in a furnace at temperature of 600~950° C. under oxygen gas atmosphere.

34. The method of claim 18, wherein at least one between the upper electrode and the lower electrode is formed of a doped polysilicon layer.

35. The method of claim 18, wherein at least one between the upper electrode and the lower electrode is formed of a metal layer.

36. The method of claim 35, wherein the metal layer is one selected from a group consisting of TiN, TaN, W, WN, WSi, Ru, $RuO_2$, Ir, $IrO_2$ and Pt and the TaON layer includes tantalum oxynitride.

37. The method of claim 36, wherein the metal layer is formed by a method selected among LPCVD, PECVD and RF magnetic sputtering.

38. A method of manufacturing a capacitor on a semiconductor substrate comprising the steps of:

forming a lower electrode over the semiconductor substrate;

surface-treating to prevent generation of natural oxide layer on a surface of the lower electrode;

depositing a TaON layer as a dielectric layer over the lower electrode in an amorphous state;

out-diffusing impurities remained in the TaON layer and crystallizing the TaON layer;

forming a barrier layer over the TaON layer; and forming an upper electrode over the TaON layer and barrier layer, wherein in the step of depositing the TaON layer, the TaON layer is formed by a surface chemical vapor reaction of Ta obtained from a precursor, $O_2$ gas and $NH_3$ gas in an LPCVD chamber to which $O_2$ gas and $NH_3$ gas are supplied with pressure of 0.1~10 Torr at temperature of 300~600° C. respectively.

39. The method of claim 38, wherein the $O_2$ gas and $NH_3$ gas are supplied by flux of 10~1000 sccm respectively.

40. The method of claim 38, wherein the TaON layer is formed by using an organic metal compound selected from the group consisting of $Ta(OC_2H_5)_5$ and $Ta(N(CH_3)_2)_5$ as a precursor, both containing Ta components.

41. The method of claim 40, wherein the Ta chemical vapor is obtained by fixing the dose of the precursor of 99.999% or above according to a flow controller and then evaporating in an evaporizer or an evaporation tube.

42. The method of claim 41, wherein the amount of Ta chemical vapor supplied in said chamber is 50~500 mg/mm.

43. The method of claim 41, wherein the evaporizer or the evaporation tube is maintained at temperature of 150~200° C.

44. The method of claim 41, wherein the TaON layer is deposited by thickness of 50~150 Å.

45. The method of claim 38, wherein the surface-treatment of the lower electrode is performed in the LPCVD chamber by using plasma in situ, and under $NH_3$ gas or $N_2/H_2$ gas atmosphere at temperature of 300~600° C. for 30 seconds 5 minutes, thereby nitrifying the surface of the lower electrode.

46. The method of claim wherein the surface-treatment of the lower electrode is performed in the manner of RTP at temperature of 650~950° C. under $NH_3$ gas atmosphere, thereby nitrifying the surface of the lower electrode.

47. The method of claim 38, wherein the surface-treatment of the lower electrode is performed in a furnace of $NH_3$ gas atmosphere in situ or ex situ at temperature of 500–1000° C., thereby nitrifying the surface of the lower electrode.

48. The method of claim 38, wherein the surface-treatment of the lower electrode is performed by cleaning with HF vapor, HF solution or HF containing compound.

49. The method of claim 48, further comprising before or after the cleaning step, a step of interface-treating by using $NH_4OH$ solution or $H_2SO_4$ solution.

50. The method of claim 38, wherein the step of surface-treating of the lower electrode further comprises a step of thermal-treating a resultant under $N_2O$ or $O_2$ gas atmosphere, and a step of depositing a nitride layer on the thermal-treated surface by thickness of 5~30 Å.

51. The method of claim 38, wherein the step of out-diffusing the impurities in the TaON layer and crystallizing the TaON layer is performed by annealing the TaON layer in a RTP chamber or in a furnace at temperature of 600~950° C. under nitrogenous gas atmosphere.

52. The method of claim 38, wherein at least one between the upper electrode and the lower electrode is formed of a doped polysilicon layer.

53. The method of claim 38, wherein at least one between the upper electrode and upper electrode and the lower is formed of a metal layer.

54. The method of claim 53, wherein the metal layer is one selected from a group consisting of TiN, TaN, W, WN, WSi, Ru, RuO$_2$, Ir, IrO$_2$ and Pt.

55. The method of claim 54, wherein the metal layer is formed by a method selected among LPCVD, PECVD and RF magnetic sputtering.

56. A method of manufacturing a capacitor on a semiconductor substrate comprising the steps of:
    forming a lower electrode over the semiconductor substrate;
    surface-treating to prevent generation of natural oxide layer on a surface of the lower electrode;
    depositing a TaON layer as a dielectric layer over the lower electrode in an amorphous state;
    out-diffusing impurities in the TaON layer and crystallizing the TaON layer;
    forming a barrier layer over the TaON layer; and
    forming an upper electrode over the TaON layer,
    wherein in the step of depositing the TaON layer, the TaON layer is formed by a surface chemical vapor reaction of Ta obtained from a precursor, O$_2$ gas and NH$_3$ gas in an LPCVD chamber to which O$_2$ gas and NH$_3$ gas are supplied with pressure of 0.1~10 Torr at temperature of 300~600° C. respectively,
    wherein the surface-treatment of the lower electrode is performed in the LPCVD chamber by using plasma in situ, and under NH$_3$ gas or N$_2$/H$_2$ gas atmosphere at temperature of 300~600° C. for 30 seconds ~5 minutes, thereby nitrifying the surface of the lower electrode.

57. The method of claim 56, wherein the O$_2$ gas and NH$_3$ gas are supplied by flux of 10–1000 sccm respectively.

58. The method of claim 56, wherein the TaON layer is formed by using an organic metal compound selected from the group consisting of Ta(OC$_2$H$_5$)$_5$ and Ta(N(CH$_3$)$_2$)$_5$ as a precursor, both containing Ta components.

59. The method of claim 56, wherein the Ta chemical vapor is obtained by fixing the dose of the precursor of 99.999% or above according to a flow controller and then evaporating in an evaporizer or an evaporation tube.

60. The method of claim 59, wherein the amount of Ta chemical vapor supplied in said chamber is 50~500 mg/mm.

61. The method of claim 60, wherein the evaporizer or the evaporation tube is maintained at temperature of 150~200° C.

62. The method of claim 56, wherein the TaON layer is deposited by thickness of 50–150 Å.

63. The method of claim 56, wherein the step of outdiffusing the impurities remained in the TaON layer and crystallizing the TaON layer is performed by annealing the resultant in which the TaON layer is deposited in the manner of RTP or in a furnace at temperature of 600~950° C. under nitrogenous gas atmosphere.

64. The method of claim 56, wherein the step of outdiffusing the impurities remained in the TaON layer and crystallizing the TaON layer is performed by annealing the resultant in which the TaON layer is deposited in the manner of RTP or in a furnace at temperature of 600~950° C. under oxygen gas atmosphere.

65. The method of claim 38, wherein at least one between the upper electrode and the lower electrode is formed of a doped polysilicon layer.

66. The method of claim 14, wherein the nitride layer comprises Si$_3$N$_4$.

67. The method of claim 31, wherein the nitride layer comprises Si$_3$N$_4$.

68. The method of claim 50, wherein the nitride layer comprises Si$_3$N$^4$.

69. A method of manufacturing a capacitor on a semiconductor substrate comprising:
    forming a lower electrode overlying the semiconductor substrate;
    depositing a TaON layer overlying the lower electrode, the TaON layer having a thickness of about 50 Å to about 150 Å;
    forming a nitride layer over the TaON layer; and
    forming an upper electrode overlying the TaON layer and nitride layer,
    wherein the TaON layer is formed by using an organic metal compound selected from the group consisting of Ta(OC$_2$H$_5$)$_5$ and Ta(N(CH$_3$)$_2$)$_5$ as a precursor, both containing Ta component.

70. The method of claim 69, wherein at least one of the upper electrode and the lower electrode is formed of a metal layer selected from a group consisting of TiN, TaN, W, WN, WSi, Ru, RuO$_2$, Ir, IrO$_2$ and Pt.

71. A method of manufacturing a capacitor on a semiconductor substrate comprising:
    forming a lower electrode overlying the semiconductor substrate;
    nitrifying a surface of the lower electrode;
    depositing a TaON layer overlying the lower electrode, the TaON layer being at least about 50 Å in thickness, the TaON layer being an amorphous layer;
    annealing the TaON layer in a nitrogen-containing atmosphere to form a nitride layer on the TaON layer; and
    forming an upper electrode overlying the TaON layer and the nitride layer.

72. A method of manufacturing a capacitor on a semiconductor substrate comprising:
    forming a lower electrode over the semiconductor substrate;
    depositing a TaON layer overlying the lower electrode, the TaON layer being of amorphous structure and having a thickness of no more than about 150 Å;
    out-diffusing impurities in the TaON layer;
    crystallizing the amorphous TaON layer;
    forming a barrier layer on the TaON layer; and
    forming an upper electrode overlying the TaON layer and barrier layer.

73. The method of claim 72, wherein the upper electrode is formed on the TaON layer after the TaON layer has been crystallized.

74. The method of claim 72, wherein the out-diffusing step and crystallizing step are performed as a single process step.

* * * * *